Oct. 17, 1961 F. L. REES 3,005,157

VARIABLE TIME DELAY PULSE GENERATOR

Filed Aug. 10, 1960

INVENTOR.
FRANK L. REES
BY [signature]
[signature]
ATTORNEYS

United States Patent Office
3,005,157
Patented Oct. 17, 1961

3,005,157
VARIABLE TIME DELAY PULSE GENERATOR
Frank L. Rees, Baltimore, Md., assignor, by mesne assignments, to the United States of America as represented by the Secretary of the Air Force
Filed Aug. 10, 1960, Ser. No. 48,788
3 Claims. (Cl. 328—55)

Figure 1:
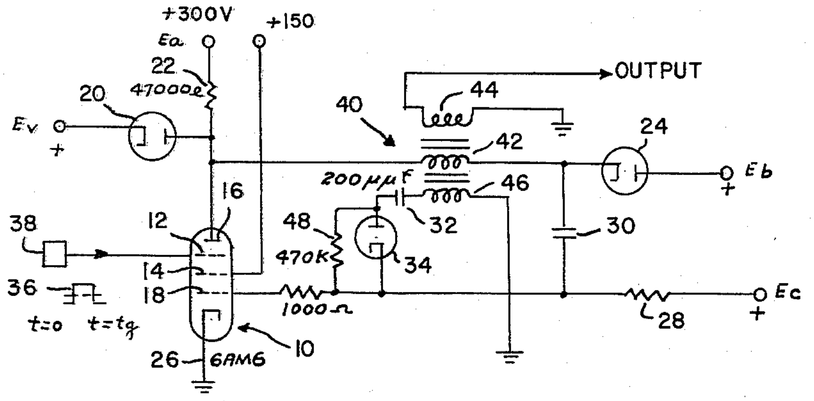

The invention relates to a pulse generator circuit which includes a single vacuum tube, discounting diodes, for providing a controllably variable time delay in the pulse output.

The requirement for economy in power consumption and reduction in size has become important with the increasing use of electronic equipment having large numbers of duplicated channels in mobile vehicles, aircraft and, in particular, missiles. In many applications, a pulse variable on a time scale, from a given reference time, is needed. Such required uses would require range markers, variable pulse delay circuits and automatic strobing circuits.

The existing variable time delay pulse generator circuits require at least an integrating stage, an amplitude comparator and a pulse generator, and a total of three vacuum tubes, plus diodes, to perform this operation. It is therefore the principal object of this invention to provide a pulse generator circuit using a single vacuum tube, discounting diodes.

Other objects, novel features, and the advantages of this invention will become apparent from consideration of the embodiments illustrated in the accompanying drawings and hereinafter described.

Figure 2:
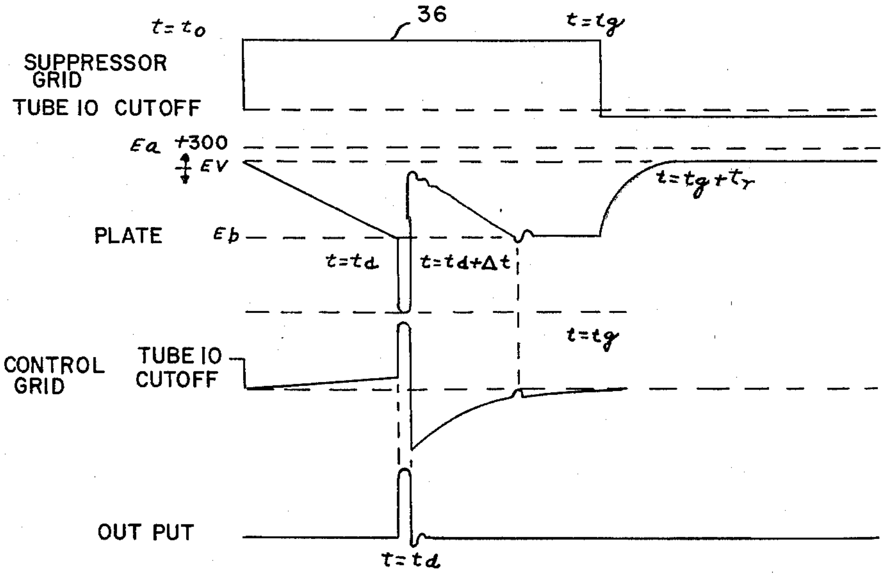

In the drawings:

FIGURE 1 is a schematic drawing illustrating the novel variable time delay pulse generator; and FIGURE 2 is a graphical illustration oft he voltage wave forms taken across different points in the variable time delay pulse generator circuit.

Referring now more particularly to FIGURE 1, the initial stable regime, existing before a gating pulse is applied, is first considered. The suppressor grid 12 of vacuum tube 10 is biased beyond cutoff so that current will flow from the tube only into the screen grid 14 circuit and not into the plate circuit 16. The plate 16 is connected through load resistor 22 to a first source of positive potential $E_a$ which is the highest potential source in the circuit. A first diode 20 will conduct via load resistor 22, setting the plate 16 at the level of the second source of variable positive potential $E_v$. The second diode 24 will be nonconductant. The control grid 18 of the electron discharge device 10 will be set at approximately ground potential, as the grid current will be drawn through the grid cathode 26 circuit up through resistor 28. A first capacitor 30 will be charged to approximately $E_v$. The second capacitor 32 will be uncharged and the third diode 34 is nonconductant.

In order to better understand the operation of the pulse generator circuit upon application of the gating waveform 36, FIGURE 2 showing voltage waveforms at various points of the circuit should now be consulted. A gating waveform or pulse 36 of period $t_0$ through $t_g$ is produced by means 38 for applying a positive gating voltage to the suppressor grid 12. On application of the gating waveform 36 to the suppressor grid 12, the suppressor bias will be overcome. This means that the plate will start to conduct the current that originally flowed in the first diode 20. The first diode 20 will now be rendered nonconductant. In order that the specific amount of current can flow in the tube or electron discharge device 10, the control grid 18 must take up a new negative potential dictated by the characteristics of the tube. From this new potential, the control grid potential will start to rise at a rate determined by the equivalent of the Miller capacity and resistance 28 exponentially towards the fourth source of positive potential $E_c$; only a very small potrion of this exponential rise is actually used. During this time, the plate potential is falling at a linear rate.

When the falling plate potential drops below that of the third source of positive potential $E_b$, the second diode 24 will conduct and current will start to flow in the first winding 42 of pulse transformer 40. The pulse voltage across this winding set up by this change of current will induce a corresponding pulse voltage, but of opposite polarity, in the second winding 46. The change of voltage across winding 46 will be rising positive causing the tube to draw increasing current through winding 42. This action is cumulative and a landslide of control grid voltage eventually terminates when a large pulse of grid current flows through the third diode 34 and charges the condenser 32 negatively. The duration and mode of this surge of current are functions of the transconductance of the tube 10, circuit losses and the leakage inductance and stray capacitance of the pulse transformer 40. At the termination of the surge, a reverse landslide of voltage occurs, driving the control grid 18 beyond cutoff. The diode 34 becomes nonconductant and the charge of the condenser 32 can only leak away through the high back resistance of the diode or a shunt path of high resistance 48 provided when a vacuum diode is used. The condenser 32 and the diode 34 act as means for insuring that a single pulse is generated during the gating period and that the circuit is restored to its original quiescent state.

The plate winding 42 surge of voltage will have amplitude determined by the fixed potential $E_b$ and the potential at which the plate "bottoms" with a positive grid drive. Thus, $E_b$ is chosen accordingly. The potential $E_v$ is made variable and together with the run-down rate, which is a function of capacitor 30 and resistance 28, determines the delay time interval between switching on and pulsing. The potential difference $(E_a - E_b)$ should be large so that high run-down rates can be achieved when moderately long delay is required. High run-down rates are desirable if time jitters due to the indeterminant contact potentials of the second diode 24 are to be reduced to negligible proportions. The output winding 44 is a tertiary winding used to extract an isolated output at any desired impedance.

The recovery time $t_r$ will be dependent upon capacitor 30 recharging through the control grid-cathode resistance and that of load resistance 22, and the condenser 32 discharging through the back path of diode 34. The longer of these times will control the recovery period.

Control over the delay period $t_d$ can be obtained for a more restricted range. This may be accomplished by keeping the run-down rate and hence the time period for the plate to read the potential $E_b$, when the circuit becomes regenerative.

The pulse transformer 40 has a core of radiometal with the first winding 42 wound in one layer next to the core which consists of forty (40) turns of No. 30 S.W.G. silk covered wire. Six turns of 0.001 inch insulation paper are wound around the first winding and the second winding 46, which consists of sixty (60) turns of similar wire, is wound on top of the insulation. Another six (6) turns of the insulation paper are wound around the second winding and the output winding is wound around the second layer of insulation paper with the number of turns governed by the output impedance required.

The invention, with the component values and vacuum tube types indicated as representative in the drawings, are not intended to limit the invention and the examples of embodiments shown and described but may, on the contrary, be capable of many modifications.

I claim:

1. A variable time delay pulse generator comprising: an electron discharge device having a plate and a cathode with a control grid normally set approximately at ground potential and a suppressor grid normally biased beyond cutoff placed between the plate and cathode; a transformer having first, second and output windings; a first source of high positive potential; a second source of variable positive potential for determining the said time delay interval between switching on and pulsing; a third source of positive potential for determining the amplitude of the pulse flowing in said second winding; a fourth source of positive potential; the magnitudes of said sources of potentials range from high to low in the order of first through fourth sources; a first diode normally conducting having its anode connected to said first potential source and to the plate of said discharge device, and its cathode connected to the said second potential source; a second diode normally nonconducting having its anode connected to said third potential source, and its cathode connected to the plate of said discharge device through said first winding and to the control grid of said discharge device through a first capacitor; means for connecting said fourth potential source to said control grid through a resistance; means including a second capacitor for connecting said control grid to the cathode of said discharge device through said second winding; and means for applying a positive gating voltage to the suppressor grid for a predetermined time, thereby allowing the plate of said discharge device to conduct and rendering said first diode nonconducting, causing said second diode to conduct when the potential of said plate falls below the potential of said third potential source, and the resultant surge of voltage forming said pulse in said output winding.

2. A variable time delay pulse generator comprising: an electron discharge device having a plate and a cathode with a control grid normally set approximately at ground potential and a suppressor grid normally biased beyond cutoff placed between the plate and cathode; a transformer having first, second and output windings: a first source of high positive potential; a second source of variable positive potential for determining the said time delay interval between switching on and pulsing; a third source of positive potential for determining the amplitude of the pulse flowing in said second winding; a fourth source of positive potential; the magnitudes of said sources of potential range from high to low in the order of first through fourth sources; a first diode normally conducting having its anode connected to said first potential source and to the plate of said discharge device, and its cathode connected to the said second potential source; a second diode normally nonconducting having its anode connected to said third potential source and its cathode connected to the plate of said discharge device through said first winding and to the said control grid of said discharge device through a first capacitor; means for connecting said fourth potential source to said control grid through a resistor; means including a second capacitor for connecting said control grid to the cathode of said discharge device through said second winding; means for applying a positive gating voltage to the suppressor grid for a predetermined time, thereby allowing the plate of said discharge device to conduct and rendering said first diode nonconducting, causing said second diode to conduct when the potential of said plate falls below the potential of said third potential source, and the resultant surge of voltage forming said pulse in said output winding; and means comprising a diode poled in direction of grid current flow connected between the said control grid and the said second capacitor.

3. A variable time delay pulse generator comprising: an electron discharge device having a plate and a cathode with a control grid normally set approximately at ground potential and a suppressor grid normally biased beyond cutoff placed between the plate and cathode; a transformer having first, second and output windings; a first source of high positive potential; a second source of variable positive potential for determining the said time delay interval between switching on and pulsing; a third source of positive potential for determining the amplitude of the pulse flowing in said second winding; a fourth source of positive potential; the magnitudes of said sources of potential range from high to low in the order of first through fourth sources; a first diode normally conducting having its anode connected to said first potential source and to the anode of said discharge device, and its cathode connected to the said second potential source; first and second capacitors; a second diode normally nonconducting having its anode connected to said third potential source and its cathode connected to the plate of said discharge device through said first winding and to the control grid of said discharge device through said first capacitor; a third diode normally nonconducting having its anode connected to the cathode of said discharge device through said second capacitor and said second winding in the order named and its cathode connected to the said control grid; means for connecting said fourth potential source to said control grid through a resistor; and means for applying a positive gating voltage to the suppressor grid for a predetermined time, thereby allowing the plate of said discharge device to conduct and rendering said first diode nonconducting, causing said second diode to conduct when the potential falls below the potential of said third potential source and the resultant surge of voltage forming said pulse in said output winding, and terminating said pulse when a large surge of grid current flows through said third diode and negatively charges said condenser followed by a reverse surge of voltage which drives the said control grid beyond cutoff.

References Cited in the file of this patent

UNITED STATES PATENTS 2,672,554 Roussel --------------- Mar. 16, 1954